United States Patent
Lai et al.

(10) Patent No.: US 9,111,064 B2
(45) Date of Patent: Aug. 18, 2015

(54) ADJUSTING SIZES OF CONNECTORS OF PACKAGE COMPONENTS

(71) Applicant: Taiwan Semiconductor Manufacturing Company, Ltd., Hsin-Chu (TW)

(72) Inventors: Chih-Wei Lai, Hsin-Chu (TW);
Ming-Che Ho, Tainan (TW);
Tzong-Hann Yang, Taipei (TW); Chien Rhone Wang, Hsin-Chu (TW);
Chia-Tung Chang, Junan (TW);
Hung-Jui Kuo, Hsin-Chu (TW);
Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/317,763

(22) Filed: Jun. 27, 2014

(65) Prior Publication Data
US 2014/0308764 A1 Oct. 16, 2014

Related U.S. Application Data

(62) Division of application No. 13/299,100, filed on Nov. 17, 2011, now Pat. No. 8,791,579.

(51) Int. Cl.
| H01L 21/44 | (2006.01) |
|---|---|
| G06F 17/50 | (2006.01) |
| H01L 23/488 | (2006.01) |
| H01L 23/00 | (2006.01) |

(52) U.S. Cl.
CPC .......... *G06F 17/5072* (2013.01); *H01L 23/488* (2013.01); *H01L 24/11* (2013.01); *H01L 24/13* (2013.01); *H01L 24/14* (2013.01); *H01L 2224/034* (2013.01); *H01L 2224/03912* (2013.01); *H01L 2224/0401* (2013.01); *H01L 2224/05016* (2013.01); *H01L 2224/05124* (2013.01); *H01L 2224/05144* (2013.01); *H01L 2224/05147* (2013.01); *H01L 2224/05552* (2013.01); *H01L 2224/05572* (2013.01); *H01L 2224/05666* (2013.01); *H01L 2224/1147* (2013.01); *H01L 2224/11462* (2013.01); *H01L 2224/11464* (2013.01); *H01L 2224/11849* (2013.01); *H01L 2224/13006* (2013.01); *H01L 2224/13012* (2013.01); *H01L 2224/13014* (2013.01); *H01L 2224/13083* (2013.01); *H01L 2224/13111* (2013.01); *H01L 2224/13147* (2013.01); *H01L 2224/13155* (2013.01); *H01L 2224/13164* (2013.01); *H01L 2224/1403* (2013.01); *H01L 2224/14132* (2013.01); *H01L 2924/00014* (2013.01)

(58) Field of Classification Search
CPC .... H01L 23/488; H01L 24/11; G06F 17/5072
USPC .................................. 438/612, 613
See application file for complete search history.

(56) References Cited

U.S. PATENT DOCUMENTS

| 5,569,960 | A | 10/1996 | Kumazawa |
|---|---|---|---|
| 5,828,128 | A | 10/1998 | Higashiguchi |
| 6,580,169 | B2 | 6/2003 | Sakuyama |

(Continued)

*Primary Examiner* — Luan C Thai
(74) *Attorney, Agent, or Firm* — Slater & Matsil, L.L.P.

(57) ABSTRACT

A device includes a plurality of connectors on a top surface of a package component. The plurality of connectors includes a first connector having a first lateral dimension, and a second connector having a second lateral dimension. The second lateral dimension is greater than the first lateral dimension. The first and the second lateral dimensions are measured in directions parallel to a major surface of the package component.

20 Claims, 12 Drawing Sheets

(56) References Cited

U.S. PATENT DOCUMENTS

| | | |
|---|---|---|
| 6,780,023 B2 | 8/2004 | Miyagawa |
| 7,084,500 B2 | 8/2006 | Swnson |
| 7,564,130 B1 * | 7/2009 | Li .................................. 257/734 |
| 8,723,319 B2 * | 5/2014 | Wang ............................ 257/738 |
| 2007/0290345 A1 | 12/2007 | Clevenger |
| 2010/0090333 A1 | 4/2010 | Hayashi |
| 2011/0248398 A1 | 10/2011 | Parvarandeh |

* cited by examiner

ADJUSTING SIZES OF CONNECTORS OF PACKAGE COMPONENTS

PRIORITY CLAIM AND CROSS-REFERENCE

This application is a divisional of U.S. patent application Ser. No. 13/299,100, entitled "Adjusting Sizes of Connectors of Package Components," filed on Nov. 17, 2011, which application is incorporated herein by reference.

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance and the density of modern integrated circuits.

On top of the interconnect structures, connector structures are formed. The connector structures may include solder balls or metal pillars that are exposed on the surface of the respective chip. Electrical connections are made through the solder balls or the metal pillars to connect the chip to a package substrate or another die.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming connectors for package components is provided in accordance with various embodiments. The intermediate stages of designing and manufacturing the connectors in accordance with the embodiments are illustrated. The variations of the embodiments are discussed. Throughout the various views and illustrative embodiments, like reference numbers are used to designate like elements.

Figure 1:
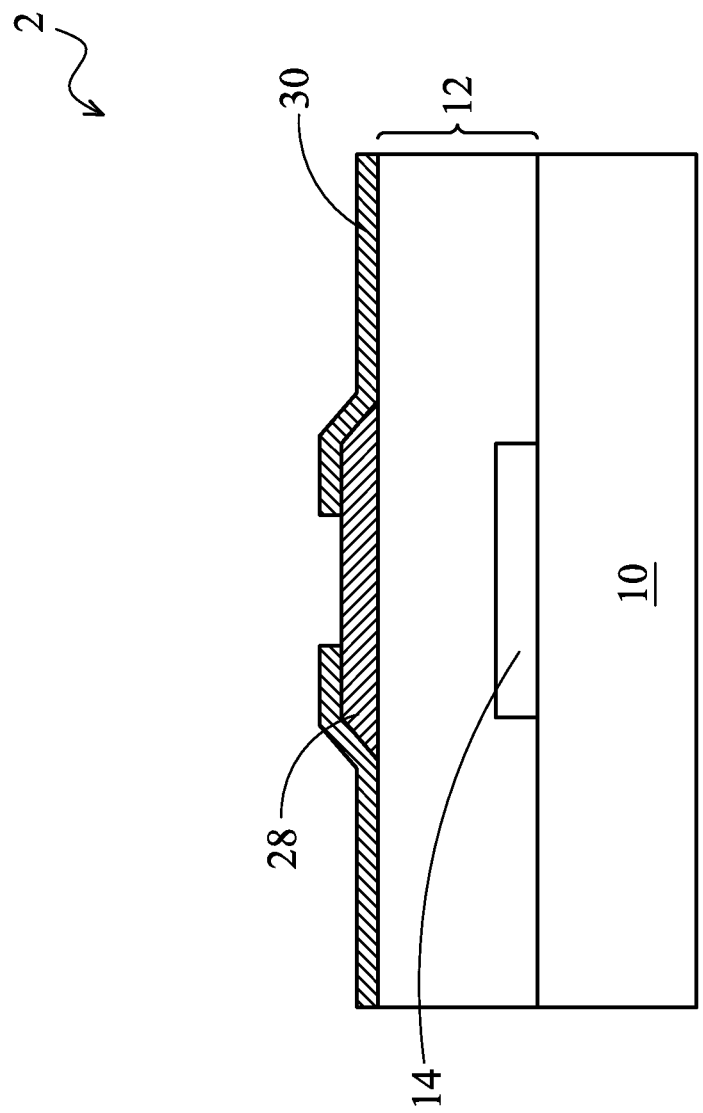
FIGS. 1, 2, 3A, 3B, 4A, 4B, and 5, are cross-sectional views of intermediate stages in the manufacturing of connectors on a surface of a package component in accordance with various embodiments.

Referring to FIG. 1, package component 2 is provided. Throughout the description, package component 2 is also referred to as chip 2, which may be a part of a wafer. Chip 2 includes substrate 10. In some embodiments, substrate 10 is a semiconductor substrate such as a silicon substrate, although it may be formed of other semiconductor materials such as silicon germanium, silicon carbon, gallium arsenide, or the like. Semiconductor devices 14, which may include transistors, diodes, resistors, or the like, may be formed at the surface of substrate 10. Interconnect structure 12, which includes metal lines and vias (not shown) formed therein and electrically coupled to semiconductor devices 14, is formed over substrate 10. The metal lines and vias may be formed of copper or copper alloys, and may be formed using damascene processes. Interconnect structure 12 may include an inter-layer dielectric (ILD) and inter-metal dielectrics (IMDs).

In alternative embodiments, chip 2 is an interposer or a package substrate, and is substantially free from active devices including transistors and passive devices such as resistors, capacitors, inductors, and/or the like. In these embodiments, substrate 10 may be formed of a semiconductor material or a dielectric material, and connectors may be formed on opposite sides of substrate 10, and electrically coupled to each other.

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. In an exemplary embodiment, metal pad 28 comprises aluminum copper. Metal pad 28 may be electrically coupled to semiconductor devices 14, for example, through the underlying interconnect structure 12. Passivation layer 30 may be formed to cover edge portions of metal pad 28. In an exemplary embodiment, passivation layer 30 is formed of polyimide or other dielectric materials such as silicon oxide, silicon nitride, and multi-layers thereof.

Figure 2:
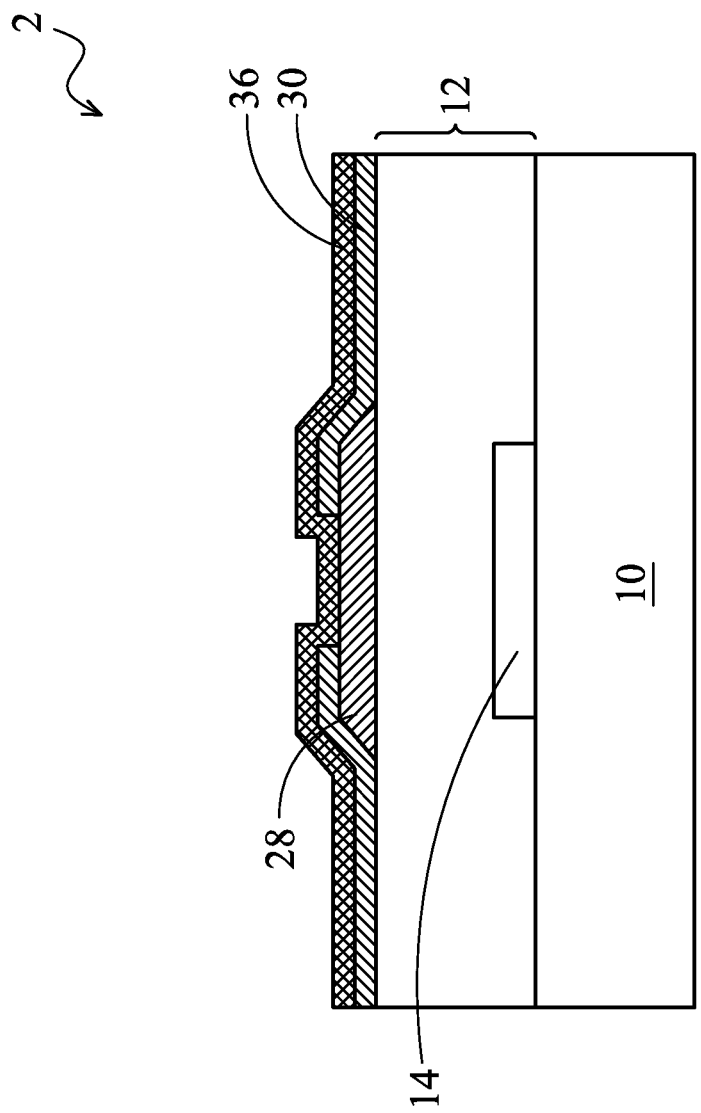
Figure 3A:
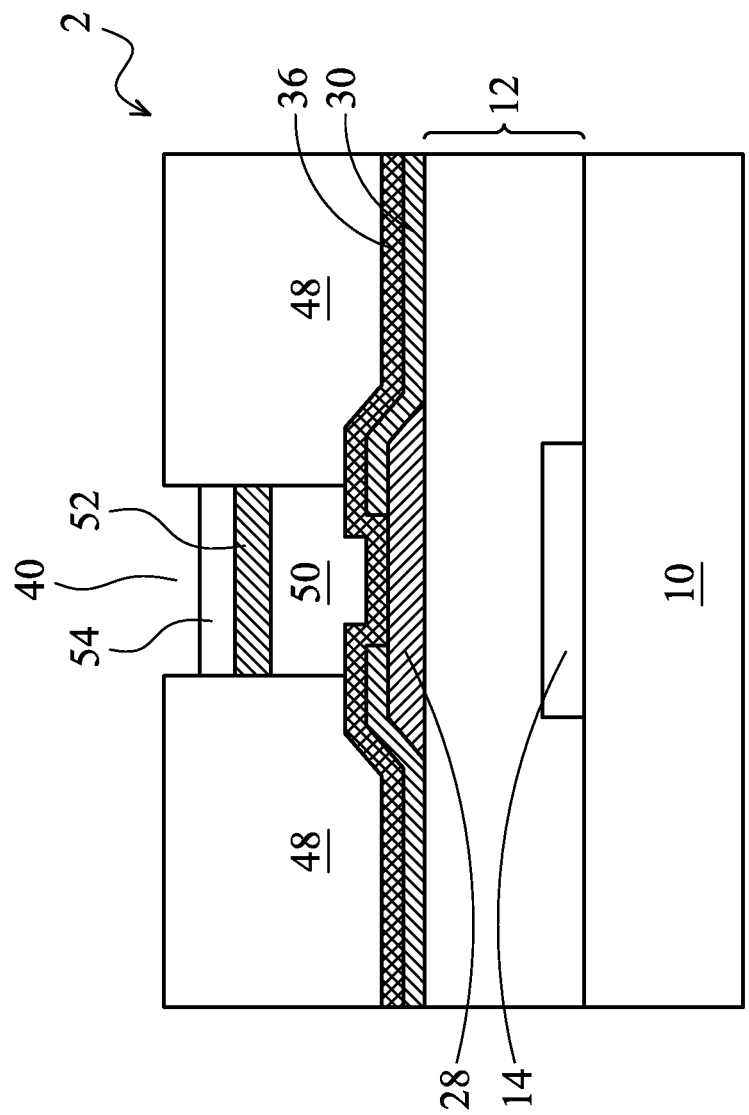

Referring to FIG. 2, under-bump metallurgy (UBM) layer 36 is formed. In an embodiment, UBM layer 36 may include a titanium layer, and a copper seed layer on the titanium layer. FIG. 3A illustrates the formation of mask 48, which may be formed of a photo resist or a dry film, for example. Mask 48 is patterned, and a portion of UBM layer 36 is exposed through opening 40 in mask 48. Next, metal pillar 50 is formed. In an embodiment, the wafer of chip 2 is placed into a plating solution (not shown), and a plating step is performed to form metal pillar 50. Metal pillar 50 is located on UBM layer 36 and in opening 40. The plating may be an electro-plating, an electro-less plating, an immersion plating, or the like. In exemplary embodiments, metal pillar 50 comprises pure copper, substantially pure copper, or a copper alloy.

Metal cap 52 may be formed on metal pillar 50. In an embodiment, metal cap 52 comprises nickel. In alternative embodiment, metal cap 52 comprises other materials such as tin, palladium, or alloys thereof. Metal cap 52 may also be a composite layer comprising multiple layers such as a nickel layer, a palladium layer, or the like. Next, solder cap 54, which may comprise Sn—Ag, Sn—Cu, Sn—Ag—Cu, or the like, is formed on metal cap 52. Both metal cap 52 and solder cap 54 may be plated, for example, using electro plating, with mask 48 acting as the plating mask.

Figure 4A:
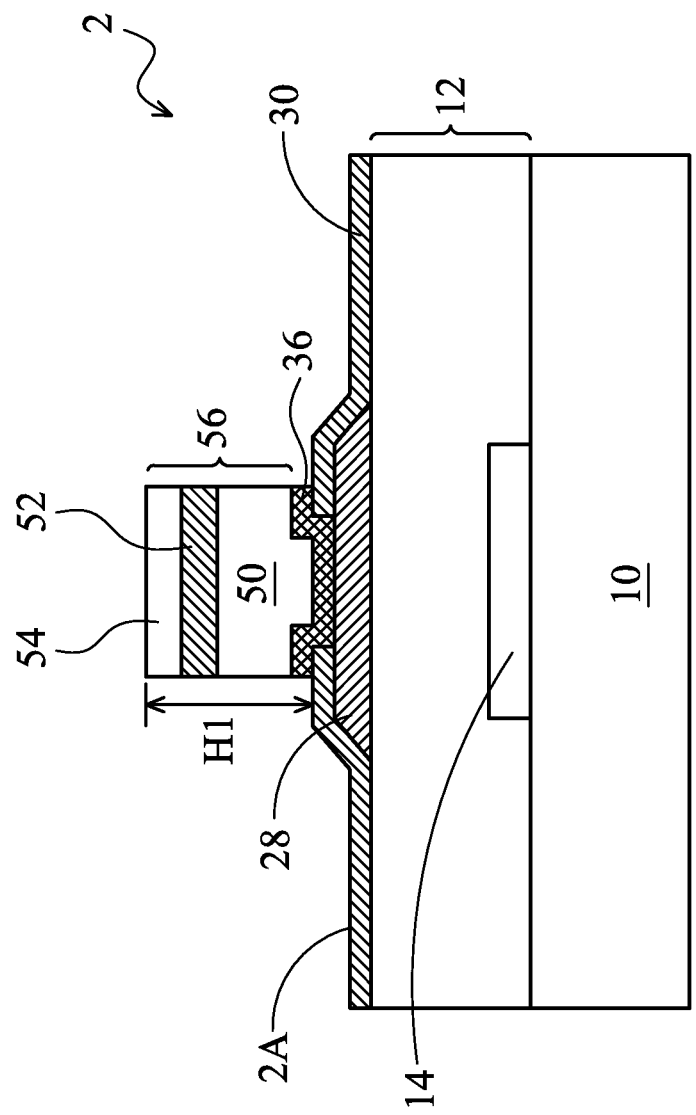

After the formation of metal pillar 50/metal cap 52/solder cap 54, mask 48 may be removed. The portions of UBM layer 36 that were covered by mask 48 are then removed, for example, through etching. The resulting structure is shown in FIG. 4A. In the resulting structure, metal pillar 50, metal cap 52, and solder cap 54 are in combination referred to as connector 56 (or alternatively referred to as a metal bump) hereinafter.

Figure 3B:
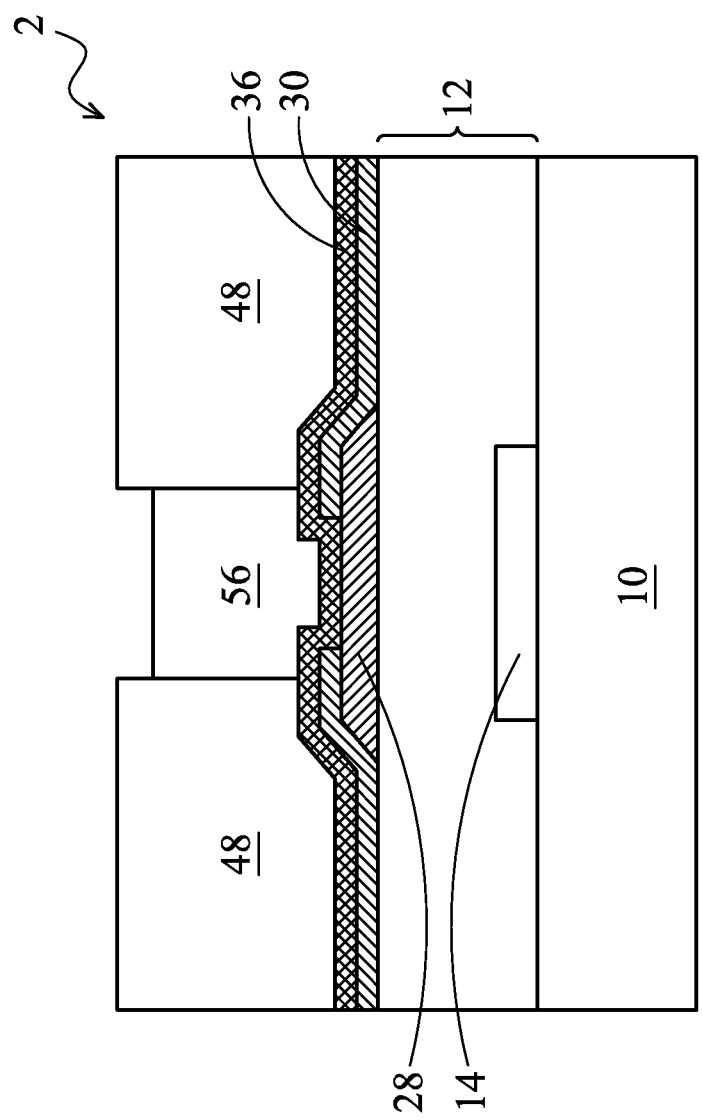
Figure 4B:
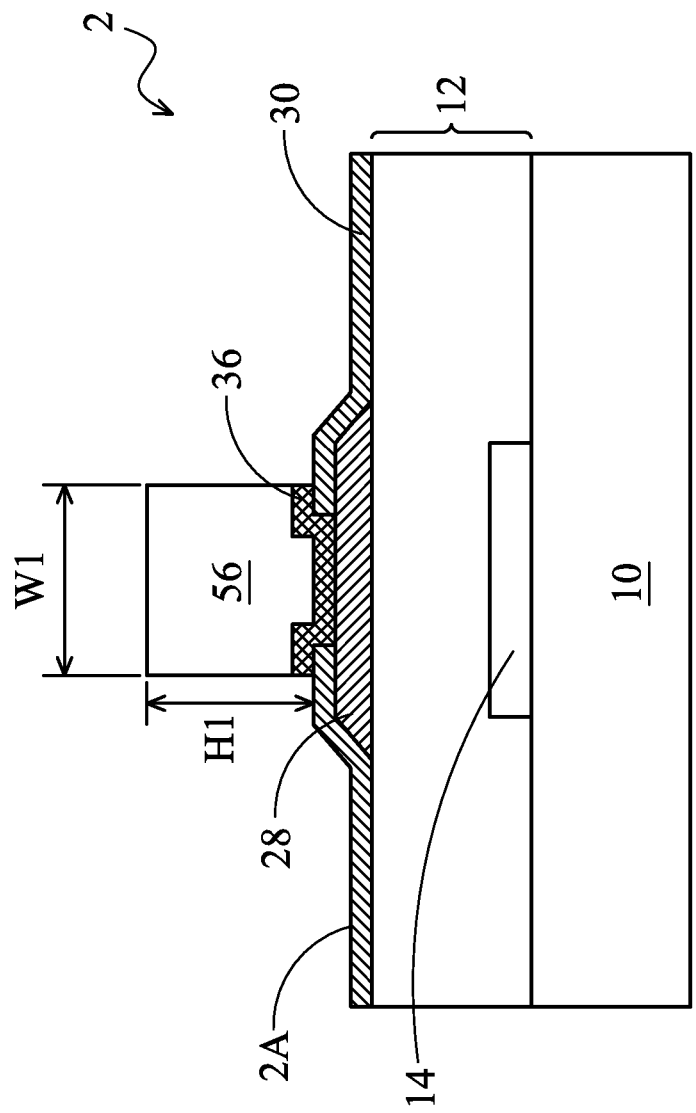
Figure 5:
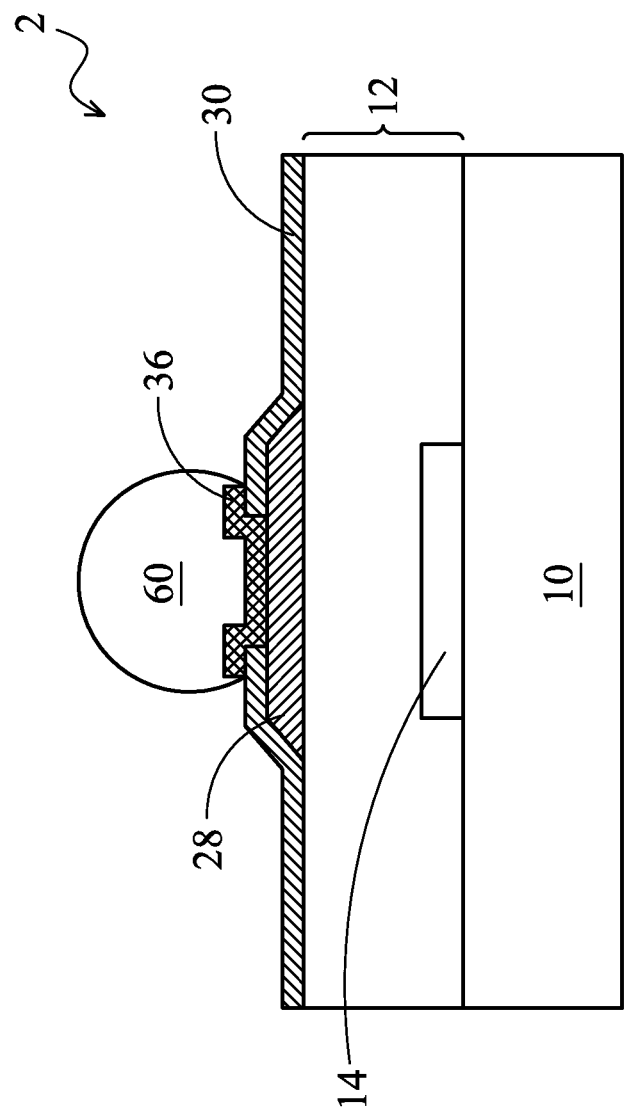

FIG. 3B illustrates an alternative embodiment, wherein connector 56 is a solder pillar that is plated, for example, using electro plating, with mask 48 acting as the plating mask. Next, as shown in FIG. 4B, mask 48 and the portions of UBM layer 36 that are covered by mask 48 are removed. A reflow is then performed to melt solder pillar 56 to form solder ball 60, as shown in FIG. 5.

Throughout the description, referring to FIGS. 4A and 4B, the lateral dimensions of connectors 56 are referred to lateral dimensions W1 hereinafter. Lateral dimensions W1 are measured in directions parallel to major top surface 2A of package component 2. Heights H1 of connectors 56 are also marked in FIGS. 4A and 4B.

Figure 6:
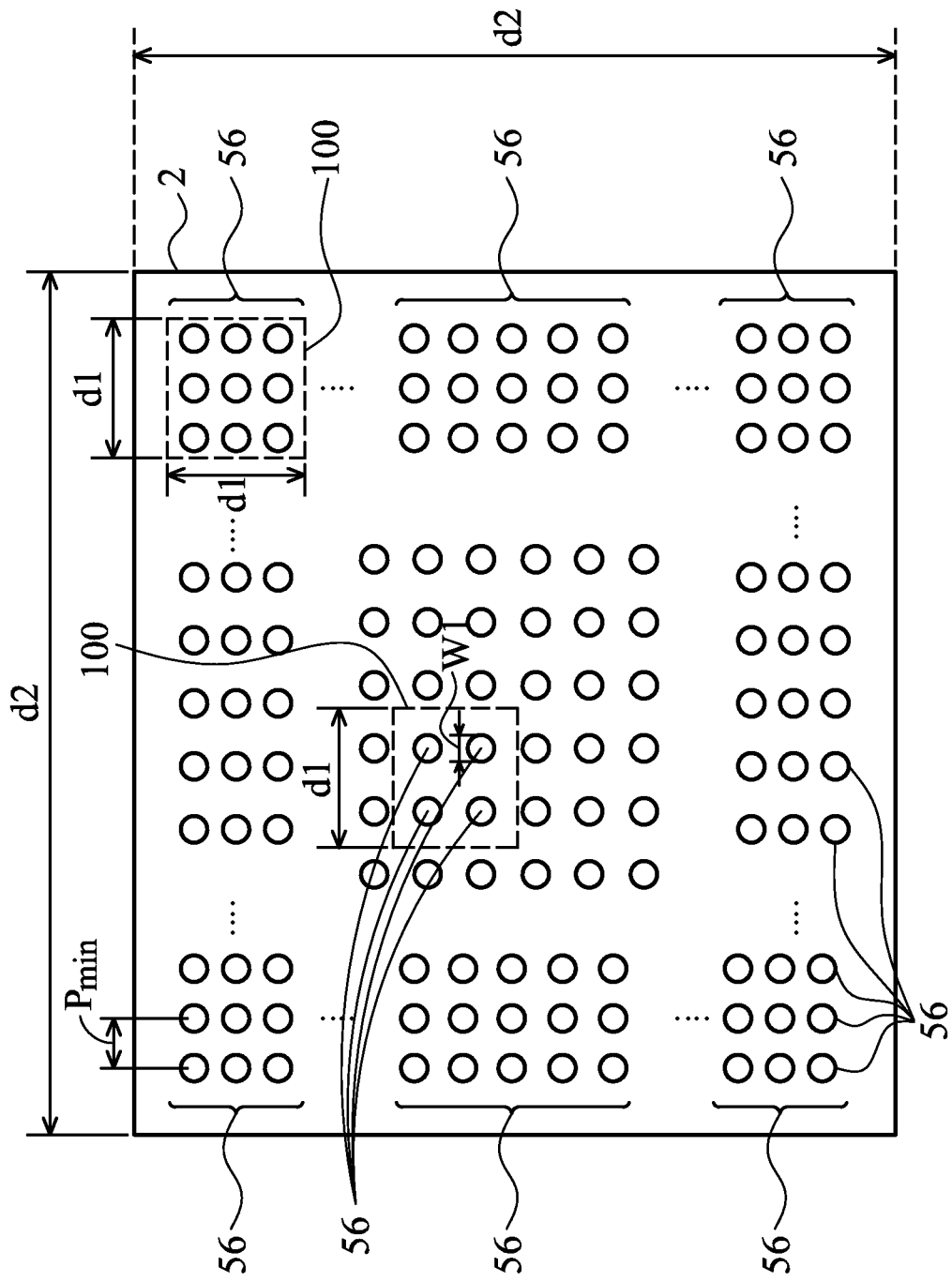
FIG. 6 illustrates a top view of a connectors in a first design of a package component in accordance with embodiments.

FIG. 6 illustrates a top view of an intermediate design of chip 2, which includes a plurality of connectors 56 on the top surface of chip 2. It is appreciated that chip 2 is a design (referred to as the first design hereinafter) of chip 2, rather than a physical chip. The lateral dimensions (sizes) W1 of connectors 56 may be uniform throughout chip 2. Chip 2 includes some (local) surface regions (referred to as sparse regions hereinafter) in which connectors 56 are sparser than in other (local) surface regions (which are referred to as dense regions hereinafter). The sparse regions have connector densities smaller than the connector densities of the dense regions. The connector density of a local surface region 100 of chip 2 may be calculated by adding the top-view areas of all connectors 56 in the respective local region 100 to obtain a total connector area in the respective local region 100, and dividing the total connector area by the total area of local region 100. Local regions 100 may be defined as having dimensions d1 (referring to FIG. 6), which may be greater than four times, or greater than six times, the minimum pitch Pmin of connectors 56 in the respective chip 2. Alternatively, local regions 100 may be defined to have dimension d1 (referring to FIG. 6) greater than one tenth of the respective chip dimension d2.

Experiments were performed to study the relationship between connector densities in the local regions and connector heights H1 (as shown in FIGS. 4A and 4B) of connectors 56 in the local regions. It was observed that on a same chip 2, connectors 56 in the dense regions have smaller heights H1, and connectors 56 in the sparse regions have greater heights H1, even though all connectors 56 in the same chip 2 are formed simultaneously. Furthermore, if two local surface regions have the same connector density, connector heights H1 in these two local surface regions are substantially equal to each other.

Based on these findings, lateral dimensions W1 (FIGS. 4A, 4B and 6) of connectors 56 in chips are adjusted to make the connector densities throughout chip 2 more uniform. Lateral dimensions W1 of connectors 56 in the first design of chips are accordingly modified to generate a second design, which is implemented on physical chips/wafers. In the modification, the lateral dimensions W1 of connectors 56 in the sparse regions may be increased. The lateral dimensions W1 of connectors 56 in the dense regions may be reduced.

In some embodiments, before the modification, the average connector density $BD_{avg}$ on chip 2 is calculated first, and the lateral dimensions W1 of connectors 56 in each of local regions 100 is modified, so that the connector densities in the respective local regions 100 are adjusted to substantially equal to the average connector density $BD_{avg}$. It is noted that when lateral dimensions W1 are modified, the locations of connectors 56 in the respective chip 2 may not be changed.

Again referring to FIG. 6, with the first design of chip 2 and connectors 56 provided, the average connector density $BD_{avg}$ may be calculated. Since connectors 56 throughout package component 2 may have the same size in the first design, the average connector density $BD_{avg}$ may be calculated by multiplying the area of a single connector 56 with the total count of connectors 56 on chip 2 to obtain the total (top-view) area of all connectors 56 in chip 2. The total area of connectors 56 is then divided by the total area of chip 2 to obtain average connector density $BD_{avg}$.

In FIG. 6, exemplary local region 100 with dimension d1 (and with an area equal to $d1^2$) is defined. The local connector density $BD_{local}$ may be calculated as the total area of all connectors 56 in local area 100 divided by area $d1^2$. Accordingly, Equation 1 may be expressed as:

$$BD_{avg} = (C \times W1^2 \times \text{con\_count}_{local})/\text{total\_area}_{local} \qquad [\text{Eq. 1}]$$

wherein $\text{con\_count}_{local}$ is the total count of connectors 56 in the local region, and $\text{total\_area}_{local}$ is the total area of local region 100, and may be equal to $d1^2$ in the exemplary embodiment. Factor C is a shape factor, wherein ($C \times W1^2$) represents the area of a single connector 56 that has dimension W1.

Figure 7:
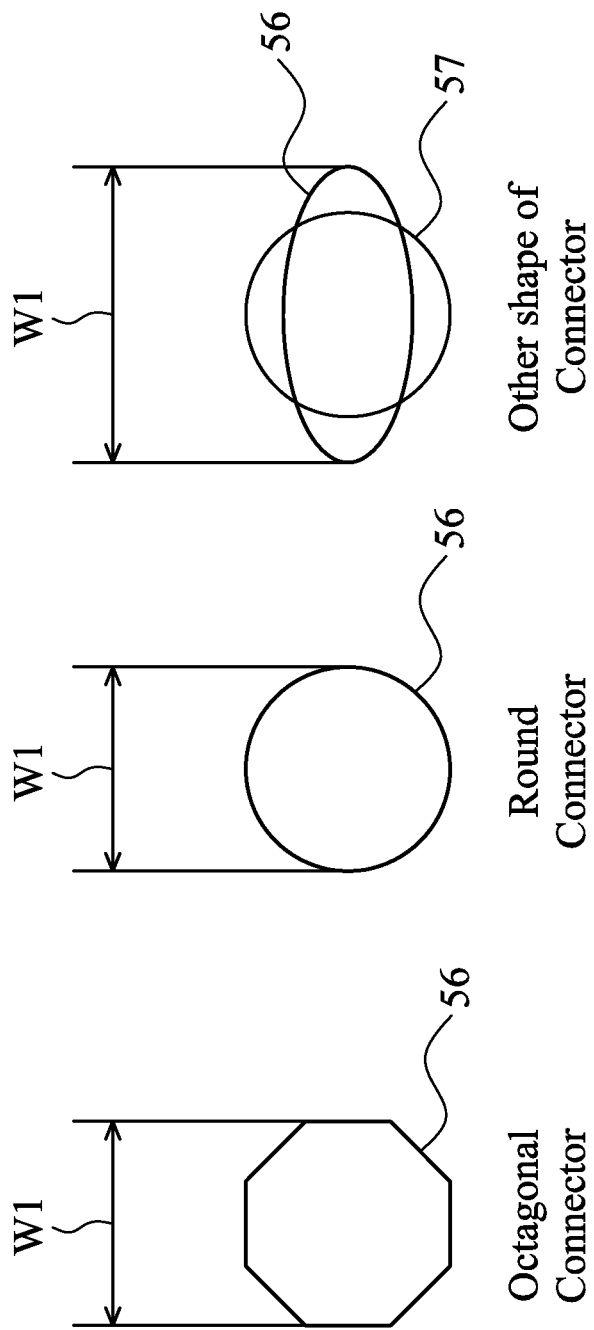
FIG. 7 illustrates top views of connectors in accordance with embodiments.

FIG. 7 illustrates top views of some exemplary connectors 56, which are used to explain the concept of shape factor C. It is realized that the top-view shapes of connectors 56 may be circles, hexagons, octagons, squares, or the like. Shape factor C is related to the shape of connector 56. For example, when connector 56 has a round shape with the diameter equal to W1, shape factor C is $\pi/4$. When connector 56 has an octagon shape with lateral dimension equal to W1, shape factor C is $2/(1+\text{sqrt}(2))$, wherein sqrt is the operator "square root." When connector 56 has another shape, such as an ellipse, shape factor C may also be derived, for example, by drawing equivalent circle 57 having the same area as the ellipse, and calculating shape factor C.

Based on Equation 1, in order to adjust the local connector density in a local region 100 to equal to average connector density $BD_{avg}$, lateral dimensions of all connectors 56 in the local region are modified to equal to $W_{adj}$, which may be expressed as:

$$W_{adj} = \text{sqrt}((BD_{avg} \times \text{total\_area}_{local})/(\text{con\_count}_{local}/C)) \qquad [\text{Eq. 2}]$$

Figure 8:
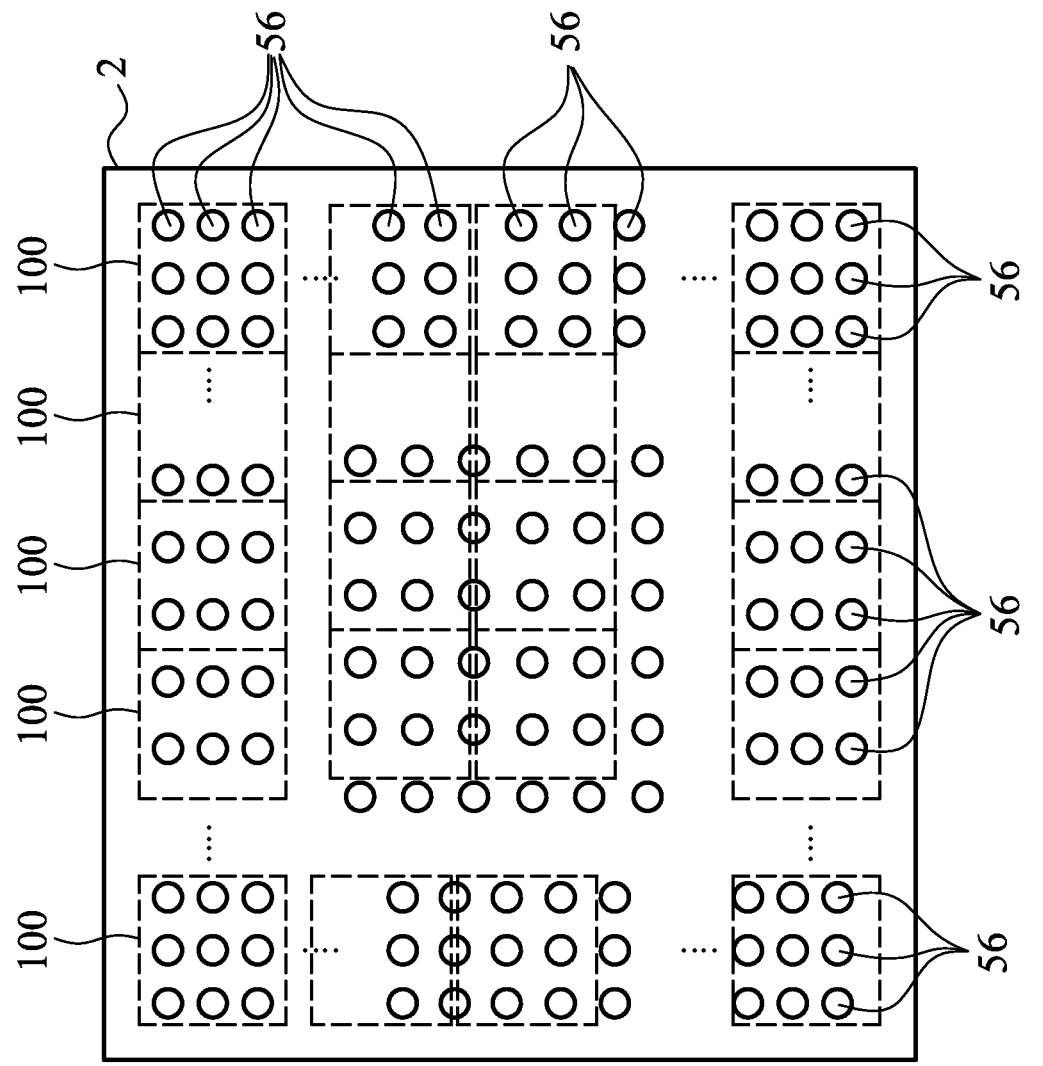
FIG. 8 illustrates the defining of local regions in the first design of the package component.
Figure 9:
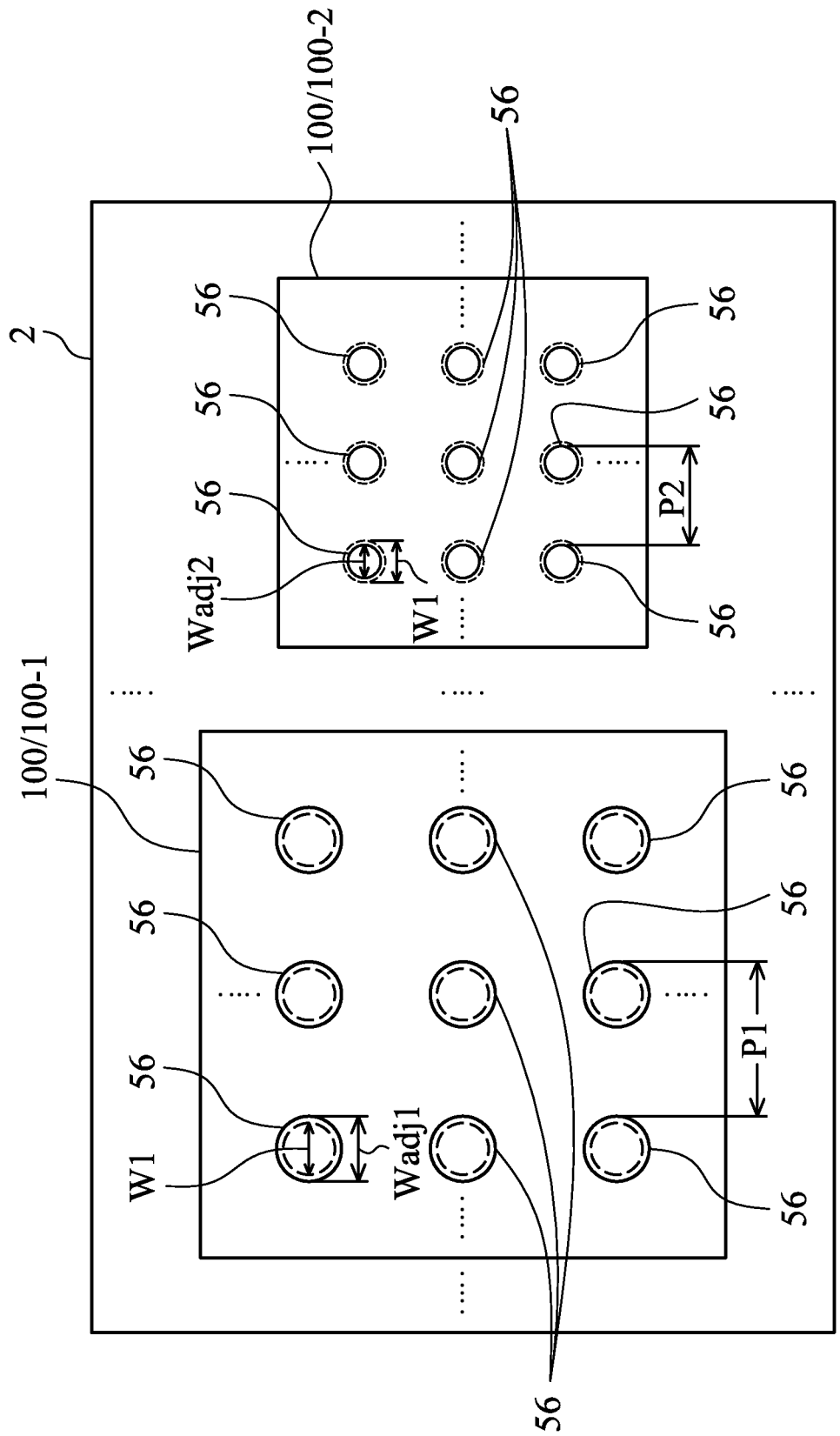
FIG. 9 illustrates two local surface regions in accordance with embodiments, wherein in a second design of the package component, the connectors in one surface region are enlarged from the first design, while the connectors in one surface region are shrunk from the first design.

As can be seen from FIG. 8, chip 2 can be divided into a plurality of local regions 100. In accordance with some embodiments, local regions 100 are defined, so that all local regions 100 added up will cover the entire chip 2. Exemplary local regions 100 are illustrated in FIG. 8. The desirable modified lateral dimension of connectors 56 in each of the local regions 100 may be calculated using Equation 2. After all local regions 100 are traversed, and the corresponding connectors 56 in all local regions 100 are adjusted to the respective lateral dimensions $W_{adj}$, the connector densities of all local regions 100 on chip 2 are equal to, or substantially equal to, $BD_{avg}$. A second design of connectors 56 of chip 2 is thus generated. FIG. 9 illustrates portions of the exemplary second design. The second design may then be implemented on a physical chip, wherein FIG. 9 may also represent portions of the top surface of physical chip.

Since values $\text{con\_count}_{local}$ of different local regions 100 may be different, the resulting $W_{adj}$ of different local regions 100 may be different from each other, although they can also be the same. FIG. 9 schematically illustrates a top view of portion of two local regions 100 (denoted as 100-1 and 100-2) of chip 2. Please note that FIG. 9 may also be drawn as similar to FIG. 6, except the sizes of connectors 56 are adjusted to different lateral dimensions, and the illustrated local regions 100-1 and 100-2 are two exemplary local regions. Solid circles represent connectors 56 after the size modification, while dashed circles represent connectors 56 before the size adjustment. In local region 100-1, which is a sparse region, the lateral dimension of connectors 56 is adjusted from W1 to $W_{adj1}$, which may be greater than the original lateral dimension W1. In local region 100-2, which is a dense region, the lateral dimension of connectors 56 is adjusted from W1 to $W_{adj2}$, which may be smaller than the original lateral dimension W1. In some embodiments, the shape of connectors 56 before the adjustment may be the same as the shape of connectors 56 after the adjustment. For example, if the original shape of connector 56 is a circle, the shape of the adjusted connector 56 is also a circle. If the original shape of connector 56 is a hexagon, the shape of the adjusted connector 56 is also a hexagon.

In some of the exemplary embodiments that connectors 56 are uniformly distributed in local regions 100-1 and 100-2, pitches P1 in local region 100-1 and pitches P2 in local region 100-2 may have the relationship:

$$P1/W_{adj1} = P2/W_{adj2} \quad [\text{Eq. 3}]$$

It is noted that there may be a plurality of local regions (such as local region 100-1), in which the respective adjusted lateral dimensions $W_{adj1}$ are greater than the original width W1 and different from each other. Furthermore, there may be a plurality of local regions (such as local region 100-2), in which the respective adjusted lateral dimensions $W_{adj1}$ are smaller than the original width W1 and are different from each other.

In some embodiments, design rules may require that for a certain design, the maximum lateral dimension of connectors on a chip cannot be greater than a pre-defined maximum lateral dimension Wmax, and cannot be smaller than a pre-defined minimum lateral dimension Wmin. Accordingly, if the $W_{adj}$ value that is obtained through Equation 2 is greater than maximum lateral dimension Wmax, the lateral dimension of the respective connectors 56 in the corresponding local region 100 will be set to Wmax, rather than to the calculated $W_{adj}$ value. Conversely, if the $W_{adj}$ value that is obtained through Equation 2 is smaller than minimum lateral dimension Wmin, the lateral dimension of the respective connectors 56 in the corresponding local region 100 will be set to Wmin, rather than to the calculated $W_{adj}$ value.

Design rules may also require that for a certain design, the maximum connector density of connectors on a chip cannot be greater than a pre-defined maximum connector density BDmax, and cannot be smaller than a pre-defined minimum connector density BDmin. Accordingly, the adjustment of the lateral dimension is limited by the values of BDmax and BDmin. The following Equation thus needs to be followed:

$$\text{sqrt}(BDmin/BDmax) \leq W_{adj}/W1 \leq \text{sqrt}(BDmax/BDmin) \quad [\text{Eq. 4}]$$

wherein $W_{adj}$ represents the adjusted lateral dimension of any connector on the chip.

In accordance with some exemplary embodiments, value BDmax is 26%, and value BCmin is 4%. Accordingly, sqrt (BDmax/BDmin) is equal to about 2.55. The value of $W_{adj}$/W1 may thus be set to a value between 1/2.55 and 2.55, and cannot be out of this range. As a result, after the adjustment of the lateral dimensions of connectors in a chip design, the ratio of the lateral dimension of the largest connector on a chip to the lateral dimension of the smallest connector on the chip may be smaller than about sqrt (BDmax/BDmin), or about 2.55 in the given example.

Figure 10:
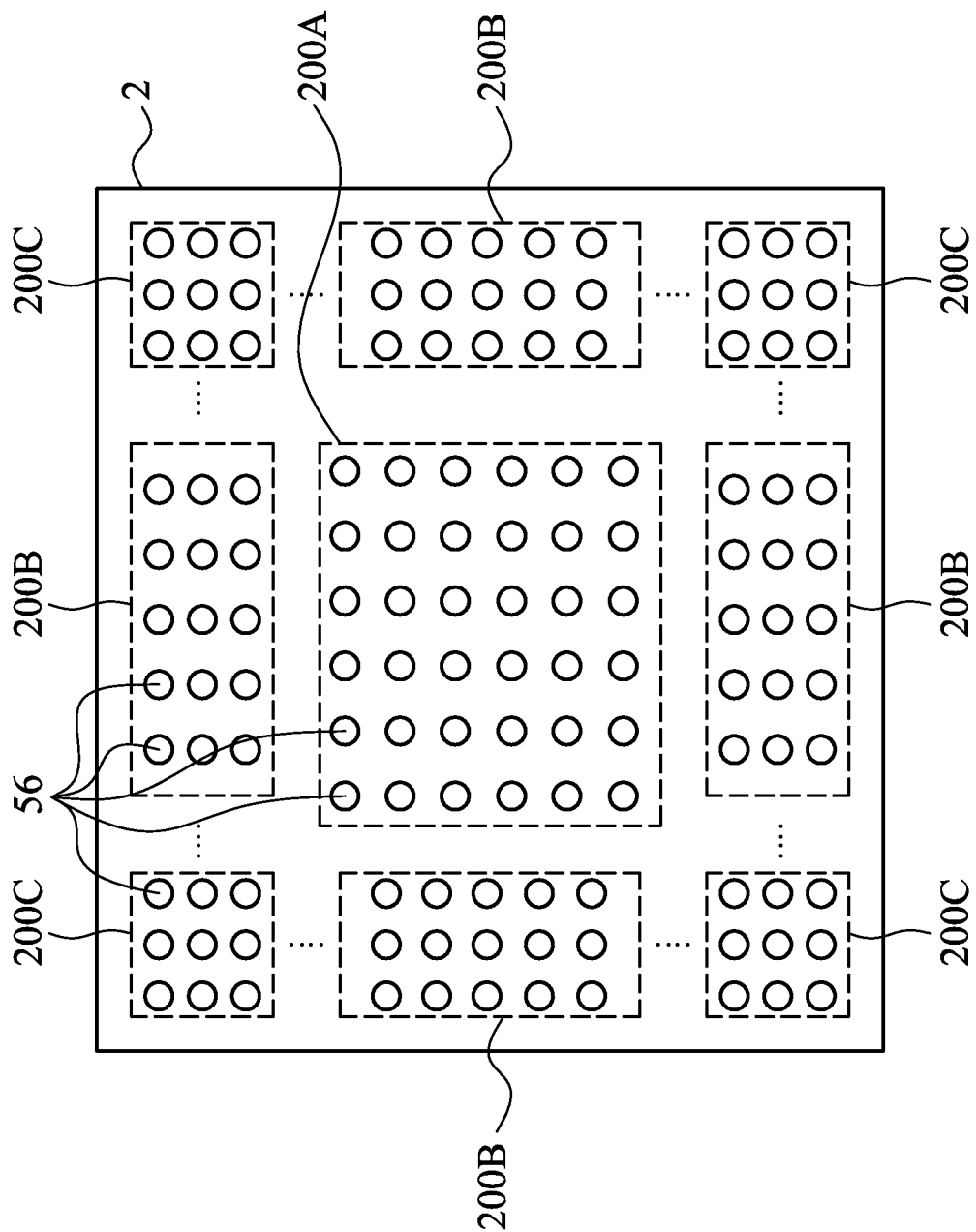
FIG. 10 illustrates sections of a first design of a package component, wherein in accordance with embodiment, sizes of the connectors in the first design are modified to generate the second design.

As shown in FIG. 10, chip 2 may include a plurality of sections 200 (denoted as 200A, 200B, and 200C), wherein connectors 56 in the same section 200 have the same connector density, while different sections 200 may have different connector densities. Inside each of sections 200, connectors 56 may be distributed uniformly. A section 200 may include a plurality of surface regions that is separated from each other by other sections. For example, section 200B includes four separated regions. In exemplary embodiments, assuming there are n sections on a chip, wherein n is an integer greater than 1, the following Equation may be used to calculate the average connector density of chip 2:

$$BD_{avg} = \sum_{i=1}^{n} \frac{BDi}{n} \quad [\text{Eq. 5}]$$

wherein BDi is the connector density of section i (which may be 200A, 200B, or 200C, etc.), which may also be calculated by adding up the areas of all connectors in section i, and dividing the total area of all connections in section i by the total area of section i.

The following equation may be used to calculate the desirable connector density BDi in each of sections i, with i being 1 through n:

$$W_{adj\_i} = \text{sqrt}((BD_{avg} \times \text{total\_area}_i)/(\text{con\_count}_i/C)) \quad [\text{Eq. 6}]$$

wherein $W_{adj\_i}$ is the lateral dimensions of connectors 56 in section i after the size adjustment, $\text{total\_area}_i$ is the total area of section i, $\text{con\_count}_i$ is the total count of connectors 56 in section i, and C is the shape factor. $BD_{avg}$ is obtained from Equation 5, and is also the desirable average connector density that is to be achieved by the size adjustment.

It is appreciated that by using Equations 5 and 6, the ratio R of the lateral dimension of the largest connector in a chip to the lateral dimension of the smallest connector in the chip may have the relationship:

$$1 < R \leq \text{sqrt}((\text{total\_area}_{max}/\text{con\_count}_{max})/(\text{total\_area}_{min}/\text{con\_count}_{min})) \quad [\text{Eq.7}]$$

wherein value $\text{total\_area}_{max}$ is the total area of the section whose connector density is the highest among all connector densities in the respective chip. Value $\text{total\_area}_{min}$ is the total area of the section whose connector density is the lowest among all connector densities in the respective chip. Value $\text{con\_count}_{max}$ is the total count of all connectors in the section whose connector density is the highest in the respective chip. Value $\text{con\_count}_{min}$ is the total count of all connectors in the section whose connector density is the lowest in the respective chip.

It is realized that after the above-discussed connector size adjustment in accordance with embodiments, average connector density $BD_{avg}$ may be changed. This may occur when, for example, if equations 5 through 7 are used to adjust the connector size. In accordance with some embodiments, iteration may be performed, and the above-discussed steps regarding equations 5 through 7 may be repeated to further adjust connector sizes based on the adjusted sizes. The iteration may be repeated, until the calculated $W_{adj\_i}$ values converge to a predefined threshold.

Using equations 1 through 4 or equations 5 through 7, the lateral dimensions of the connectors on a chip may be adjusted to different values to generate the second design of chip 2, as illustrated in illustrative FIG. 9. The second design as shown in FIG. 9 may then be implemented on physical semiconductor chips/wafers, wherein the steps as shown in FIGS. 1 through 4 are performed to form the connectors 56 that have the adjusted sizes. The resulting chip 2 may be represented by FIGS. 4A/4B and FIG. 9.

The steps as related to Equations 1 through 7 may be performed by a computer, which includes software and hardware. Furthermore, the intermediate and final results of the embodiments may be saved on non-transitory computer-readable medium such as hard drives, discs, and the like. For example, the various patterns such as what are shown in FIGS. 6 and 9 may be saved on the non-transitory computer-readable medium. In addition, the calculation steps as related to Equations 1 through 7 may also be executed by a computer, which retrieves program codes for performing the calculation in accordance with embodiments. The program codes may also be saved in a non-transitory computer-readable medium such as hard drives, discs, and the like.

In accordance with embodiments, by adjusting connector sizes, the connector density throughout a chip/wafer may be more uniform than if all connectors have the same lateral dimensions. Accordingly, the heights of the connectors are more uniform, and the co-planarity of the top surfaces of the connectors is improved. This also results in the reduced defective joints. Bonding processes with very strict requirement to the co-planarity may also be achieved with improved reliability.

In accordance with embodiments, a device includes a plurality of connectors on a top surface of a package component. The plurality of connectors includes a first connector having a first lateral dimension, and a second connector having a second lateral dimension. The second lateral dimension is greater than the first lateral dimension. The first and the second lateral dimensions are measured in directions parallel to a major surface of the package component.

In accordance with other embodiments, a package component includes a first local surface region, and a first plurality of connectors on a top surface of a package component and uniformly distributed in the first local surface region, wherein the first plurality of connectors has a first lateral dimension. The package component further includes a second local surface region, and a second plurality of connectors on the top surface of the package component and uniformly distributed in the second local surface region. The second plurality of connectors has a second lateral dimension, and the second lateral dimension is greater than the first lateral dimension.

In accordance with yet other embodiments, a method includes forming a first connector on a surface of the package component, wherein the first plurality of connectors has a first lateral dimension, and forming a second connector on the surface of the package component. The second plurality of connectors has a second lateral dimension greater than the first lateral dimension. The first and the second plurality of connectors are formed simultaneously.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a plurality of connectors on a top surface of a package component, wherein the forming the plurality of connectors comprises:
   forming a first plurality of connectors in a first local surface region of the package component, wherein each of the first plurality of connectors has a first lateral dimension, and the first local surface region has a first connector density equal to a ratio of a total top-view area of all connectors in the first local surface region to a total top-view area of the first local surface region; and
   forming a second plurality of connectors in a second local surface region of the package component, wherein each of the second plurality of connectors has a second lateral dimension different from the first lateral dimension, with the first and the second lateral dimensions measured in directions parallel to a major surface of the package component, wherein the second local surface region has a second connector density equal to a ratio of a total top-view area of all connectors in the second local surface region to a total top-view area of the second local surface region, and wherein the first connector density is substantially equal to the second connector density.

2. The method of claim 1 further comprising:
   modifying a first design of the package component to generate a second design, wherein the modifying the first design comprises:
   reducing a uniform lateral dimension of the first plurality of connectors in the first design to the first lateral dimension in the second design; and
   increasing the uniform lateral dimension of the second plurality of connectors in the first design to the second lateral dimension in the second design.

3. The method of claim 2 further comprising implementing the second design of the package component on the package component, wherein the implementing the second design comprises performing a plating to form the first and the second plurality of connectors.

4. The method of claim 2 further comprising:
   before the reducing and the increasing, calculating an average connector density of all connectors in the first design of the package component;
   calculating the first lateral dimension, wherein the first lateral dimension is calculated to make the first connector density to be substantially equal to the average connector density; and
   calculating the second lateral dimension, wherein the second lateral dimension is calculated to make the second connector density to be substantially equal to the average connector density.

5. The method of claim 4, wherein a dimension obtained from the calculating the first lateral dimension is smaller than a minimum dimension allowed by design rules, and wherein the method further comprises setting the first lateral dimension to the minimum dimension.

6. The method of claim 4, wherein a dimension obtained from the calculating the second lateral dimension is greater than a maximum dimension allowed by design rules, and wherein the method further comprises setting the second lateral dimension to the maximum dimension.

7. The method of claim 1, wherein a ratio of the second lateral dimension to the first lateral dimension is smaller than about 2.55.

8. A method comprising:
    making a first design of a package component to generate a plurality of connectors having a uniform lateral size at a surface of the package component, wherein the plurality of connectors comprises a first plurality of connectors in a first local surface region of the package component and a second plurality of connectors in a second local surface region of the package component;
    modifying the first design of the package component to generate a second design, wherein the modifying the first design comprises:
        reducing the uniform lateral size of the first plurality of connectors in the first design to a first lateral dimension in the second design; and
        increasing the uniform lateral size of the second plurality of connectors in the first design to a second lateral dimension in the second design, wherein the reducing and the increasing are performed using a computer.

9. The method of claim 8 further comprising:
    performing a manufacturing process to implement the second design of the package component on the package component, wherein the manufacturing process comprises plating the first and the second plurality of connectors.

10. The method of claim 9, wherein the plating comprises plating solder regions.

11. The method of claim 8, wherein in the first design, the first and the second plurality of connectors have a first density and a second density, respectively, and in the second design, the first and the second plurality of connectors have a third density and a fourth density, respective, and wherein a first difference between the first density and the second density is greater than a second difference between the third density and the fourth density.

12. The method of claim 11 further comprising:
    before the reducing and the increasing, calculating an average connector density of all connectors in the first design of the package component;
    calculating the first lateral dimension; and
    calculating the second lateral dimension, wherein the first lateral dimension and the second lateral dimension have values allowing the third density and the fourth density to be substantially equal to the average connector density.

13. The method of claim 12, wherein a dimension obtained from the calculating the first lateral dimension is smaller than a minimum dimension allowed by design rules, and wherein the method further comprises setting the first lateral dimension to the minimum dimension.

14. The method of claim 12, wherein a dimension obtained from the calculating the second lateral dimension is greater than a maximum dimension allowed by design rules, and wherein the method further comprises setting the second lateral dimension to the maximum dimension.

15. A method comprising:
    making a first design of a package component to generate a plurality of connectors at a surface of the package component, with the plurality of connectors having a uniform lateral size, wherein the plurality of connectors comprises a first plurality of connectors in a first local surface region of the package component and a second plurality of connectors in a second local surface region of the package component;
    calculating an average connector density of all connectors in the first design of the package component; and
    modifying the first plurality of connectors to generate a second design of the package component, wherein in the first design, each of the first plurality of connectors has a first lateral dimension, and in the second design, each of the first plurality of connectors has a second lateral dimension different from the first lateral dimension, and wherein at least one of the calculating and the modifying is performed using a computer.

16. The method of claim 15, wherein in the second design, the first plurality of connectors has a density substantially equal to the average connector density.

17. The method of claim 15, wherein the modifying comprises reducing the first lateral dimension of the first plurality of connectors in the first design to the second lateral dimension in the second design.

18. The method of claim 15, wherein the modifying comprises increasing the first lateral dimension of the first plurality of connectors in the first design to the second lateral dimension in the second design.

19. The method of claim 18 further comprising modifying the second plurality of connectors to generate the second design, wherein in the first design, each of the second plurality of connectors has the first lateral dimension, and in the second design, each of the second plurality of connectors has a third lateral dimension smaller than the first lateral dimension.

20. The method of claim 15 further comprising:
    performing a manufacturing process to implement the second design of the package component on the package component, wherein the manufacturing process comprises a plating.

* * * * *